United States Patent
Wheeler et al.

[11] Patent Number: 6,015,991
[45] Date of Patent: Jan. 18, 2000

[54] ASYMMETRICAL FIELD EFFECT TRANSISTOR

[75] Inventors: Donald C. Wheeler, Beacon, N.Y.; Jeffrey P. Gambino, Gaylordsville, Conn.; Louis L. Hsu, Fishkill, N.Y.; Jack A. Mandelman, Stormville, N.Y.; Rebecca D. Mih, Wappingers Falls, N.Y.

[73] Assignee: International Business Machines Corporation, Armonk, N.Y.

[21] Appl. No.: 08/820,401

[22] Filed: Mar. 12, 1997

[51] Int. Cl.[7] ................................. H01L 29/02
[52] U.S. Cl. ............ 257/336; 257/344; 257/401; 257/408; 257/654
[58] Field of Search ................. 257/336, 344, 257/401, 408, 654

[56] References Cited

U.S. PATENT DOCUMENTS

| | | | |
|---|---|---|---|
| 4,258,465 | 3/1981 | Yasui et al. | 257/408 |
| 4,329,186 | 5/1982 | Kotecha et al. | 257/336 |
| 4,419,809 | 12/1983 | Riseman et al. | 257/401 |
| 4,599,118 | 7/1986 | Han et al. | 257/336 |
| 5,177,571 | 1/1993 | Satoh et al. | 257/336 |
| 5,234,852 | 8/1993 | Liou | 257/336 |
| 5,300,786 | 4/1994 | Brunner et al. | 250/548 |
| 5,368,962 | 11/1994 | Kiryu et al. | 430/7 |
| 5,370,975 | 12/1994 | Nakatani | 430/325 |
| 5,518,945 | 5/1996 | Bracchitta et al. | 437/44 |
| 5,547,789 | 8/1996 | Nakatani et al. | 430/5 |

FOREIGN PATENT DOCUMENTS

| | | | |
|---|---|---|---|
| 000073623 | 3/1983 | European Pat. Off. | 257/336 |
| 359096768 | 6/1984 | Japan | 257/336 |
| 401099259 | 4/1989 | Japan | 257/344 |
| 403064931 | 3/1991 | Japan | 257/401 |

OTHER PUBLICATIONS

C–H. Hsu and D–S. Wen, "Method for Making Self–Aligned, Reverse–T Gate LDD MOSFET", IBM Technical Disclosure Bulletin, vol. 32, No. 3B, Aug. 1989, pp. 154–155.

Y. Taur and L. K. Wang, "Process for Fabricating Lightly Doped Drain MOS Devices with Punch–Through Stoppers", IBM Technical Disclosure Bulletin, vol. 27, No. 11, Apr. 1985, pp. 6622–6623.

M. Hargrove, E. Miersch, G. Pittman and D. Thomas, "Integrated SCHOTTKY Diode in CMOS", IBM Disclosure Technical Bulletin, vol. 28, No. 12, May 1986, pp. 5178–5179.

R. L. Mohler aNd S. S. Roth, "LDD Sidewall Spacers without Reactive Ion Etch", IBM Technical Disclosure Bulletin, vol. 27, No. 7B, Dec. 1984, pp. 4362–4364.

*Primary Examiner*—Edward Wojciechowicz
*Attorney, Agent, or Firm*—Alison Mortinger; Jay H. Anderson

[57] ABSTRACT

Disclosed is an asymmetric field effect transistor which comprises a first region serving as source, a second region serving as drain, a thin gate oxide and a gate electrode. The gate electrode is asymmetric and one of its sidewalls is sloped. The second region extends underneath said sloped sidewall. The part of said second region which extends underneath said gate electrode is less doped than the remaining part of said second region. Furthermore, said second region has a sloped junction edge underneath said gate electrode.

20 Claims, 5 Drawing Sheets

ASYMMETRICAL FIELD EFFECT TRANSISTOR

BACKGROUND OF THE INVENTION

1. Cross-Reference to Related Patent Applications

This patent application is related to U.S. patent application entitled "Asymmetrical Resist Sidewall", and U.S. patent application entitled "Selective Reduction of Sidewall Slope on Isolation Edge", both filed on the same day as the instant patent application and presently assigned to the assignee of the instant application and the disclosure of which is incorporated herein by reference.

2. Field of the Invention

This invention relates to asymmetric field effect transistors (FETs) having a lightly doped drain.

3. Description of Related Art

In electronic component manufacture and in particular integrated circuit silicon wafer manufacturing, the key factor in delineating small patterns in the wafer is the shape of the resist pattern. The following description will be directed to integrated circuit silicon wafer manufacture and silicon devices but it will be appreciated by those skilled in the art that the invention may be applied to the manufacture of other electronic components such as gallium arsenide circuits, component packages and printed circuit boards.

In the manufacture of integrated circuit components such as semiconductors, electronic circuit pattern control, e.g., linewidth control is becoming increasingly important because of even higher integration of the circuits and the linewidth and other circuit patterns are required to be increasingly fine and precise. Pattern control in photolithographic processes, however, is negatively impacted by numerous effects ranging from resist thickness variations, bake non-uniformities, non-flat wafers, etc.

Photolithography techniques are preferably used to form the fine resist pattern to define the circuit and, in general, a wafer, on which a resist having a predetermined thickness is applied, is positioned on a wafer stage and light from a light source passes through a photo mask having a predetermined mask (circuit) pattern thereon. The light passing through the photo mask is projected onto the resist on the wafer forming the mask pattern on the resist. The resists are typically negative resists or positive resists. The exposed resist is then processed using a number of cleaning, developing and etching steps to form a pattern on the wafer either in the form of openings in the resist which are to be metallized to form the desired circuit pattern (negative resist) or in the form of a positive resist pattern delineating the desired pattern on the wafer surface to be metallized. The above photolithographic process is shown in U.S. Pat. No. 5,300,786 which is assigned to the assignee of the present invention.

In either of the negative or positive resist methods or combination resist methods (e.g., image reversal resists), it is necessary that a photo mask be used to form the pattern on the resist and, traditionally, the imaging process using optical lithography creates a plurality of resist patterns which are each, in cross-section, of substantially constant width, height and symmetry. Under some exposure conditions, the width of the resist pattern may vary somewhat with the height of the resist with the width at the base being slightly wider than the width at the top of the resist. In any event, the resist pattern is still symmetrical and a metallized circuit line would be of essentially constant cross-section measured about a vertical axis extending upward from the midpoint of the base of the resist pattern.

There are many different integrated circuit manufacturing processes that require an asymmetric resist pattern as part of the process to provide desired circuit designs, and one application, for example, is to produce a pattern for lift off processes. These methods are well known in the art.

A number of attempts have been made to create an asymmetrical resist (photoresist) profile or pattern. In U.S. Pat. No. 5,547,789 to Nakatani et al. an asymmetrical light intensity profile is used to pattern a positive resist, which resist is then converted by flood illumination into a negative resist (image reversal resist) in order to affect the placement of subsequently formed gate electrodes. The purpose of the asymmetry of the resist pattern is to create an asymmetrical placement of the gate electrode. The asymmetrical intensity profile is achieved by a pattern transfer mask comprised of a transfer substrate, a linear light shielding film pattern disposed on the transparent substrate, and a means for reducing the intensity of light transmitted through a part of the mask on either side of the light shielding film pattern. The pattern transfer mask comprises a transparent substrate having different kinds of light attenuating films placed on the transparent substrate next to the light shielding pattern such as an opaque material, a light shielding film with different thicknesses or a semi-transparent film. The resist profiles shown are strongly re-entrant on both sides of the pattern which is not acceptable for many manufacturing methods.

Another patent which shows an asymmetrical light intensity profile is U.S. Pat. No. 5,370,975 to Nakatani wherein the mask designed to create the asymmetrical light profile employs a phase shifter with an edge angle ranging from 70°–85° or 95°–110° or the phase shifter is shaped to be smoothly curved. In U.S. Pat. No. 5,300,786, supra, there is a description of a phase shift mask which can shift the intensity profile of the light for the purpose of determining and controlling the focus settings of an optical lithography exposure system. When there is a change in focus, the minimum point of the intensity profile is shifted to create an asymmetrical displacement of the photoresist pattern to the left or right direction. The intensity profile is asymmetric about the minimum intensity peak point and it is the asymmetric peak shift which creates a pattern placement error which is used in conjunction with other reference patterns to measure the focus as an overlay by an automated overlay error measurement tool.

In U.S. Pat. No. 5,368,962 to Hanyu et al. a photo mask is shown comprising a light shielding layer formed on a mask substrate and light transmission areas defined on the mask substrate by the light shielding areas. The light transmitting areas are divided with phase shifters. The above patents are hereby incorporated by reference.

An example of a symmetric FET with lightly doped drain and source regions, and a method for making such an FET is described in U.S. Pat. No. 5,518,945.

In the IBM Technical Disclosure Bulletin article "Method for making a self-aligned, reverse-T gate LDD MOSFET", Vol. 32, No. 3B, August 1989, another example of a symmetric FET is given. The FET described therein has a reverse-T type structure.

Other examples of LDD structures or methods for making the same are addressed in IBM Technical Disclosure Bulletin article "Process for fabricating lightly doped drain MOS devices with punch-through stoppers", Vol. 27, No. 11, April 1985, IBM Technical Disclosure Bulletin article "Integrated Schottky diode in CMOS", Vol. 28, No. 12, May 1986, IBM Technical Disclosure Bulletin article "LDD Sidewall Spacers without reactive ion etch", Vol. 27, No. 7B, December 1984.

It is an object of the present invention to provide a new FET structure with improved reliability and performance.

It is another object to provide a new FET structure which can be easily made.

Still other objects and advantages of the invention will in part be obvious and will in part be apparent from the specification.

SUMMARY OF THE INVENTION

The above and other objects, which will be apparent to those skilled in art, are achieved in the present invention which is directed in a first aspect to an asymmetric field effect transistor (FET) structure. An FET according to the present invention comprises a first region serving as source, a second region serving as drain, a thin gate oxide and a gate electrode. The gate electrode is asymmetric and one of its sidewalls is sloped. The second region extends underneath said sloped sidewall. The part of said second region which extends underneath said gate electrode is more lightly doped than the remaining part of said second region. Furthermore, said second region has a graded doping underneath said gate electrode. The graded doping reduces the drain electric field.

It is an advantage of this asymmetric structure that the hot carrier injection into the gate oxide on the drainside is reduced. Due to this, the reliability is improved. Due to the fact that only the drain has a lightly doped region, the series resistance is reduced in comparison to known FETs having a lightly doped source and a lightly doped drain. Another advantage is increased performance.

It is an advantage that the inventive structures can be made using processing steps which are compatible with current semiconductor manufacturing processes. Only the lithography steps need to be modified to provide asymmetric masks used for the definition of the asymmetric structure of the FET (an exemplary method for making an asymmetric mask is described later).

In an alternative embodiment spacers are formed on the sloped sidewall and the vertical sidewall of the transistor's gate. Underneath the thicker spacer a lightly doped drain is situated.

In the prior art, an asymmetric FET required an extra masking step to implant one side of the FET only, or to form an extra spacer. The extra masking step is expensive and is difficult to control, due to the high overlay tolerance that is required.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiments of the present invention, reference will be made herein to FIGS. 1–9 of the drawings in which like numerals refer to like features of the invention. Features of the invention are not necessarily shown to scale in the drawings.

Figure 1A:
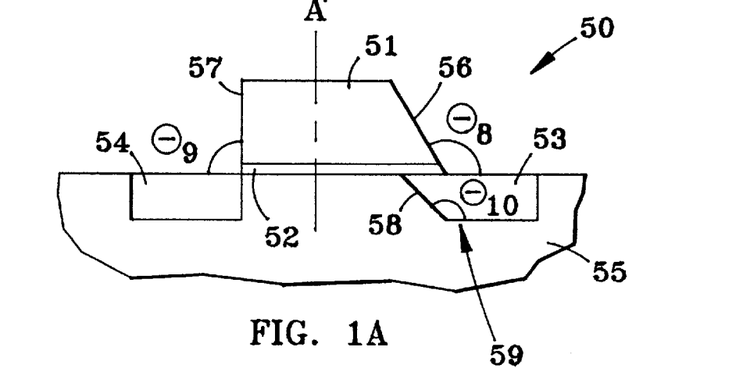
FIG. 1A shows a cross-sectional view of a first embodiment of the present invention.

Polysilicon (also referred to as polycrystalline silicon) can be formed using chemical vapor deposition (CVD), or low pressure chemical vapor deposition (LPCVD), as well as other known processes. Polysilicon is a solid composed of a myriad of small single crystal regions. In FIG. 1A a cross section of an embodiment of the present invention is shown. The field effect transistor (FET) 50 is formed in a substrate 55 and comprises a gate electrode 51, a gate oxide 52, a source region 54 and a drain region 53. The substrate 55 may be a silicon substrate, for example. The source and drain regions 54, 53 can be defined by implantation of dopants. The doped regions may be implanted vertically or angled. Well suited for n-type doping the source and drain are: P, As and Sb, and for p-type doping: B, In and Ga, for example. The more lightly doped region of the drain may have a concentration of dopants between $10^{17}$–$10^{20}$/cm$^3$, and the other parts of the source and drain regions have a concentration of dopants between $10^{18}$–$10^{21}$/cm$^3$. As gate electrode polysilicon may be used, for example. Likewise, Al or other materials may be used. The gate oxide 52 is a thin silicon dioxide layer, for example.

As can be seen, the FET 50 is asymmetric. The gate electrode 51 has a sloped sidewall 56 and a vertical sidewall 57, i.e. the gate electrode 51 is asymmetric. With other words, the left half of the gate electrode 51 (the portion left of the line A') is different than the right half (the portion right of the line A'). The angle θ8 of the sidewall 56 is larger than the angle θ9 of sidewall 57. Please note that in the present embodiment θ9 is about 90°. θ8 is typically between 90° and 150°, and preferably between 100° and 135°. Furthermore, the source and drain regions 54, 53 are asymmetric with respect to line A'. The drain region 53 has a sloped junction edge 58 having an angle θ10. This angle θ10 is larger than 90°. Please note that θ8 does not necessarily have to be the same as θ10. Typically, θ10 is between 90° and 150°. As illustrated in FIG. 1A, the drain 53 extends underneath the gate oxide 52 and gate electrode 51. The part 59 of the drain 53 which is situated underneath the gate oxide 52 and gate electrode 51 is less heavily doped than the remaining part of the drain region 53. This is also referred to as lightly doped drain structure (LDD). The concentration of dopants in the source 54 and drain 53 is about the same, with the difference that the drain 53 has a lightly doped region 59 extending underneath the gate 51, 52. This lightly doped region 59 typically extends a few nanometers to a few tens of nanometers underneath the gate. Preferably, it extends between 5 nm and 80 nm underneath the gate.

It is important to note that the source 54, which is shown having vertical sidewalls, in practice also may have sidewalls which are somewhat sloped, depending on the process used for the definition of the source region.

Figure 2:
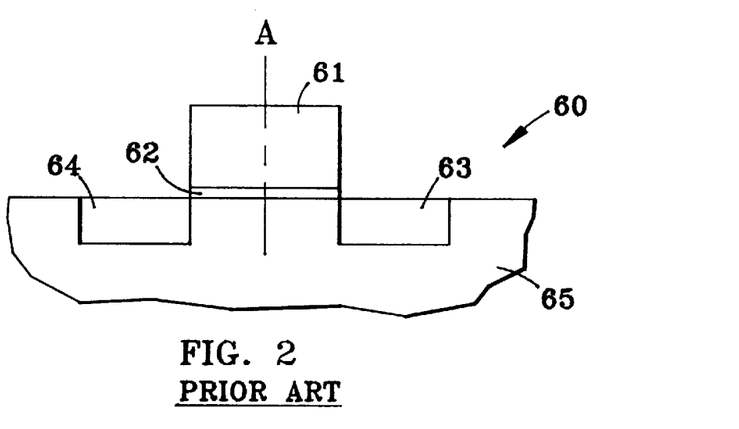
FIG. 2 shows a cross-sectional view of symmetric FET known in the art.

The cross section of a known symmetric FET structure 60 is illustrated in FIG. 2. This symmetric FET 60 is formed in a substrate 65 and comprises a gate electrode 61, a gate oxide 62, a source region 64 and a drain region 63. As can be seen, the FET 60 is symmetric with respect to the line A. The two sidewalls of the gate electrode 61 are vertical. The source and drain regions 64, 63 are also symmetrical with respect to the line A. As mentioned above, these sidewalls may be somewhat sloped, depending on the process used for the definition of the source region. Gate Induced Drain Leakage (GIDL) in such an FET may be reduced by employing a lightly doped drain (LDD). Such an LDD provides for a lateral and vertical grading of the junction profile.

Figure 3:
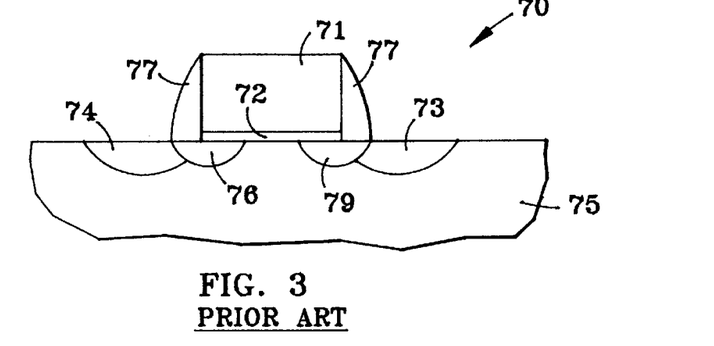
FIG. 3 shows a cross-sectional view of another symmetric lightly doped FET known in the art.

A known FET structure with lightly doped source and drain is shown in FIG. 3. This structure is described in U.S. Pat. No. 5,518,945. As can be seen in FIG. 3, a symmetric FET 70 with lightly doped drain and source regions 79, 76 is shown. This FET 70 is formed in a substrate 75. Between the gate electrode 71 and the substrate 75 a thin gate oxide 72 is situated. The sidewalls of the gate 71 are covered with sidewall spacers 77. Underneath these spacers 77 the lightly doped regions 79, 76 are formed. More heavily doped regions, serving as drain 73 and source 74, are located on the right and left hand side of the respective lightly doped regions. Embodiments of the present invention have the following advantages over known symmetric FETs without lightly doped drain regions:

The Gate Induced Drain Leakage (GIDL) is reduced by employing a lightly doped drain (LDD).

The source and drain regions are self-aligned with respect to the gate electrode due to the fact that the gate electrode (or the gate electrode together with a resist) is used as mask for the implantation of dopants.

The hot carrier injection into the gate oxide is reduced.

The reliability is improved.

Due to the fact that only the drain has a lightly doped region, the series resistance is reduced in comparison to known FETs having a lightly doped source and a lightly doped drain.

The device performance is increased.

It is to be noted that an asymmetric FET, according to the present invention can be realized on substrates other than silicon. The inventive structure could for example be realized in a GaAs material system.

Now that the basic building block—an asymmetric FET with lightly doped drain—has been addressed, different semiconductor devices can easily be realized employing one or more of the inventive asymmetric FETs. These FETs can be used in MOS and CMOS devices, DRAMs, logic devices and so forth.

The masks employed for making the inventive structures can be used in any optical lithography system known in the art. These systems may also be termed projection imaging systems and a typical system is described in U.S. Pat. No. 5,300,786, supra, where a photolithography mask structure having a novel optical focus test pattern is used to project test patterns on a resist coated semiconductor. Basically, these systems utilize an illumination source typically comprising a mirror, a laser or an arc lamp, a light filter and a condenser lens system. The illumination source outputs "light" to a mask structure which is pre-patterned as desired, e.g., to project a wiring level of an integrated circuit under fabrication. As used herein, the term "light" refers to light used in photolithography. The terms "light" and "photolithography" in the specification need not be restricted to visible light but can also embrace other forms of radiation and lithography. Light passing through the mask structure typically intersects a reduction lens which focuses the mask pattern into particular lens fields fabricated on the semiconductor wafer. The wafer is held in position by a vacuum hold device (or chuck) the position of which is controlled by an accurate X,Y,Z location controller or stepper motor.

Focus is typically quantified as an offset error in the location of the wafer in the Z dimension relative to a perfectly focused image plane. For purposes of the subject invention, the image plane can be at any point, e.g., typically either the top of the resist material or the base of the resist material or any point in between. The image plane may also be above the top of the resist or below the base of the resist.

The focus offset or defocus, as discussed hereinbelow, has either a positive or a negative Z displacement with respect to the ideal focal image plane along with a magnitude representative of the distance by which the image plane is out of focus. The vacuum hold device will typically be adjusted to provide the desired defocus to perform the method suited for making the structures according to the present invention. Another projection exposure apparatus which is generally used for pattern formation using a mask is shown in FIG. 9 of U.S. Pat. No. 5,370,975, supra.

To determine the best defocus to use to make the desired asymmetric resist sidewall, it is preferred to use a defocus matrix test procedure as part of the electronic component manufacturing process. Thus, a wafer having multiple chips thereon is coated with the photoresist, each chip exposed using a different defocus condition, then baked and developed using typical procedures. Each chip cross-section is then viewed across the resist sidewall with a scanning electron microscope (SEM) to determine the best defocus condition. For example, if the wafer has ten (10) chips, the defocus for each chip could be made to vary in the following sequence: $-1.0\,\mu m$, $-0.8\,\mu m$, $-0.6\,\mu m$, $-0.4\,\mu m$, $-0.2\,\mu m$, $0\,\mu m$, $+0.2\,\mu m$, $+0.4\,\mu m$, $+0.6\,\mu m$, $+0.8\,\mu m$. Other sequences could be used depending on the manufacturing process.

Figure 5:
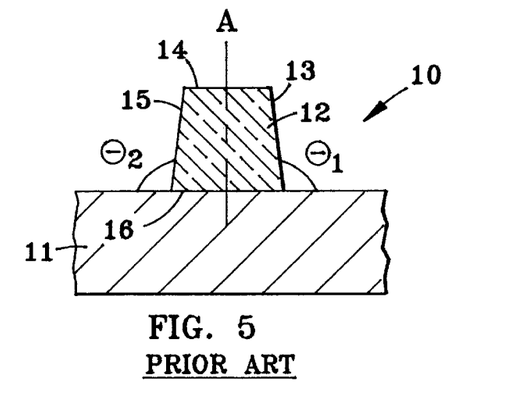
FIG. 5 shows a cross-sectional view of a substrate having a symmetric resist pattern formed thereon by the prior art.

Referring to FIG. 5, a substrate is shown containing a patterned resist generally as 10 and comprises a substrate 11 having the patterned resist 12 thereon. The patterned resist would be typically formed by exposing a substrate having a resist completely coated thereon with an exposure process and then developing the exposed resist to remove the unwanted resist and to form the pattern 12 shown in FIG. 5. The resist 12 is shown having sidewalls 13 and 15 and top 14 and base 16. A vertical axis intersecting the midpoint of the base 16 divides the resist pattern in half showing a symmetrical resist pattern. Accordingly, angles θ1 and θ2 are essentially equal.

As is well-known in the art, light exposure conditions, the type resist, bake and develop and reflection from the wafer surface will affect the shape of the resist pattern 12 but, in any event, the resist will be substantially symmetric about vertical axis A. For example, angles θ1 and θ2 while substantially equal may vary slightly depending on the above parameters. In some cases, θ1 and θ2 will be 90° forming a resist 12 having a constant cross-section from the base of the resist to the top of the resist. In FIG. 5 the cross-section is shown to get smaller going from the base of the resist pattern to the top of the resist pattern.

Figure 4:
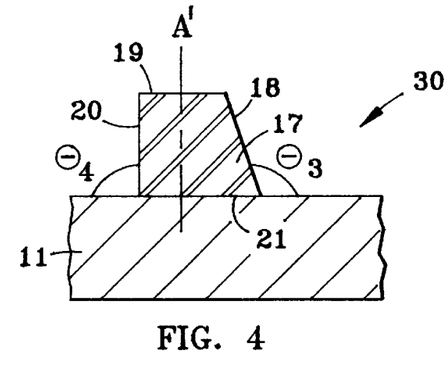
FIG. 4 shows a cross-sectional view of a substrate having an asymmetric resist formed thereon using a mask and method of the invention.

Using the mask and method described in the following, a resist shown generally as 30 in FIG. 4 may be formed. Accordingly, a substrate 11 is completely coated with a photoresist (not shown), exposed and developed to form a resist pattern 17 having sidewalls 18 and 20, a base 21 and top 19. The formed resist pattern 17 has sidewall angles θ3 and θ4. The resist 17 is asymmetric about vertical axis A' which axis bisects the base 21 of resist 17. Accordingly, angle θ3 is different than θ4. Comparing FIGS. 4 and 5, it can be seen that the symmetric resist pattern 12 of the prior art (FIG. 5) is different from the asymmetric resist pattern 17 made using the mask and method described in the following.

Figure 6:
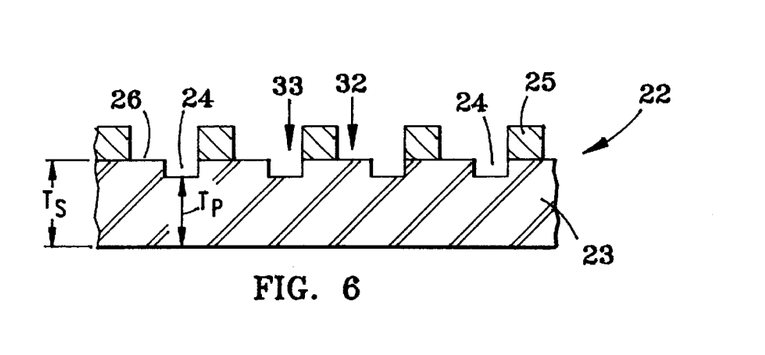
FIG. 6 shows a cross-sectional view of a mask of the invention used to form a plurality of parallel asymmetric resist patterns on a substrate.

Referring to FIG. 6, a mask is shown generally as 22. The mask 22 comprises a transparent substrate 23 having a thickness $T_s$. The substrate 23 has light shielding material 25 thereon in the form of parallel lines. Contiguous with each light shielding material 25 is a channel 24 which, in effect, reduces the thickness of substrate 23 as represented by $T_p$. The thickness of the substrate $T_s$ is therefore greater than the thickness of the substrate at channel 24 ($T_p$) and light transmitted through mask 22 has a different phase on each side 32 and 33 of light shielding material 25. The mask may be generally described as having light shielding areas 25 between areas providing a difference in phase for the light passing through the mask. More specifically, for a line mask as shown in FIG. 6, the mask comprises from left to right, a repeating pattern of phase shift means 24, light shielding means 25 and substrate 23 having a surface 26. As is well-known to those skilled in art, other methods may be used to change the phase of the light transmitted through the mask 22 such as the use of a phase shifter material such as Spin On Glass in place of the channel 24.

Figure 7A:
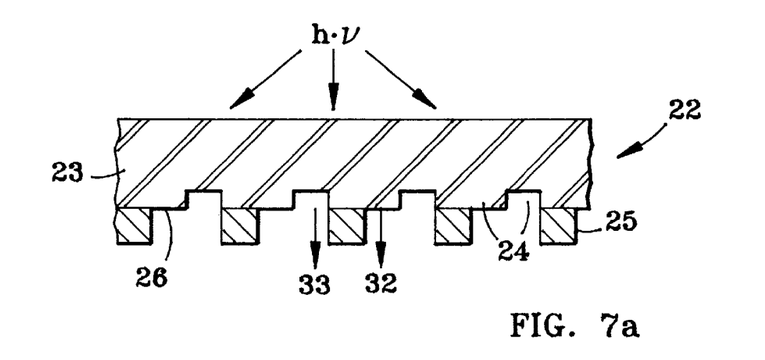
FIG. 7a shows a cross-section of a mask of the invention and FIGS. 7b and 7c show cross-sectional views of a resist pattern having asymmetric sidewalls made with a positive resist on a substrate using the mask and method of the invention.
Figure 7B:
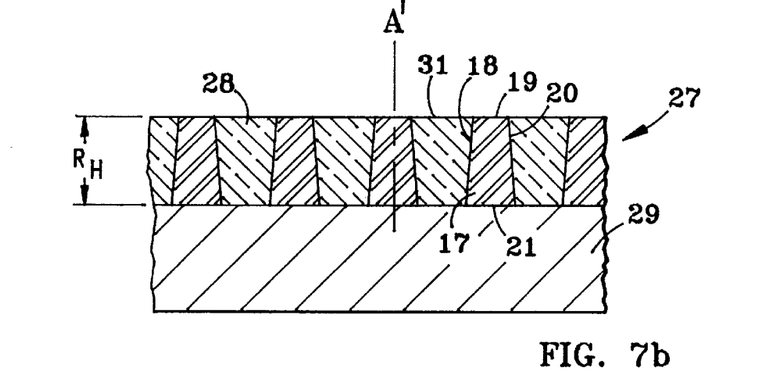
Figure 7C:
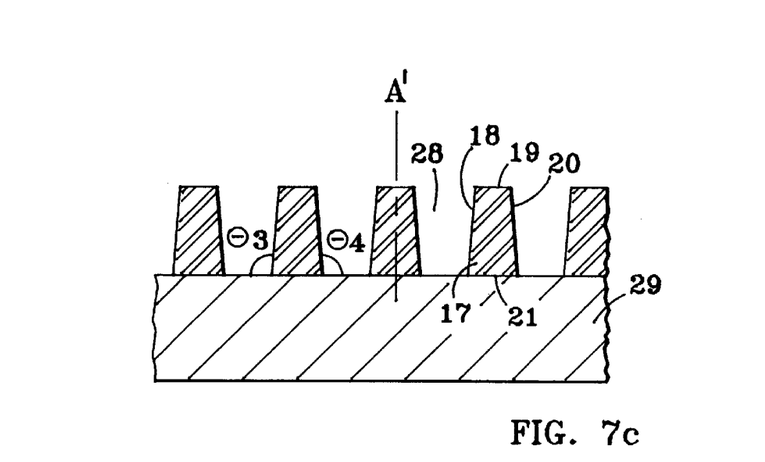

Referring to FIGS. 7a, 7b and 7c a method is shown for using such masks to form a substrate having an asymmetric resist pattern formed thereon. In FIG. 7a light is shown impinging on mask 22 of the invention which comprises a transparent substrate 23 having light shielding lines 25 thereon with contiguous channel areas 24 on one side of the light shielding material in a repeating pattern to form a phase shift of the light so that the phase of the light traveling through mask 22 is different on each side 32 and 33 of light shielding material 25.

FIG. 7b shows a semiconductor structure generally as 27 comprising a substrate 29 coated with a positive photoresist material 31. Resist patterns 17 are formed having sidewalls 18 and 20 and base 21 and top 19. The exposed resist is shown as 28 and when developed is soluble and would be removed forming the resist pattern substrate shown in FIG. 7c. As can be seen from FIG. 7c, angle θ3 is different than angle θ4 forming an asymmetric resist pattern 17 having asymmetric sidewalls 18 and 20. A vertical line A' bisecting base 21 of resist pattern 17 shows an asymmetric cross-section of the resist over the height of the resist. The resist is skewed on the side of the light shielding material having the phase shift means. The intensity profile of the light through the mask of the invention at the top of the resist in FIG. 7b is slightly asymmetric about midpoint A'. The asymmetry of the light intensity profile about midpoint A' is more pronounced at the base of the resist due to the finite thickness of the resist. A prior art mask (non-phase shift mask) would have a symmetric intensity profile which is substantially the same at the top of the resist and at the base of the resist.

Referring again to FIG. 6, a typical mask 22 of the invention is shown. The transparent material 23 may be any suitable transparent material such as glass, calcium fluoride and fused silica and is typically fused silica. The thickness of the substrate $T_s$ will generally be about 90 mils to 300 mils. It is preferred to form the phase shift of the light passing through the mask by employing channels 24 in the substrate 23 which effects a phase shift of the light by its travel through a different substrate thickness ($T_s$ versus $T_p$). The necessary thickness for a desired phase shift can be easily determined. The difference between the phases of the light passing through the mask substrate at 32 and the opposed side 33 of light shielding material 25 must be other than 0° or 180°, or multiples thereof. In a highly preferred embodiment, it is preferred that the difference in phase of the light be 90°. Thus, the light passing through point 32 is the transmitted light from the exposure apparatus and the light passing through point 33 is phase shifted 90° or any other desired angle other than 0° or 180°, or multiples thereof.

The light shielding material 25 may be any suitable material such as molybdenum silicide and chrome and is typically chrome which is applied using conventional means such as sputtering or metal evaporation, preferably sputtering. The thickness of the light shielding material may vary widely and is generally about 50 nm to 150 nm. The purpose of the light shielding material 25 is to prevent light from passing through the mask where the material 25 is present onto the resist coated substrate being imaged.

Referring again to FIG. 7b, the substrate 29 is typically silicon or other semiconductor material and the resist material may be any photoresist such as a negative resist or a positive resist. While any resist may be used, it is preferred that the resolution of the resist be a medium or high resolution resist as is well-known in the art.

It is important that the resist, thickness of the resist, the difference in phase of the light on each side of the light shielding material, the focus and light exposure dose during exposure be specially controlled either singly or preferably in combination to provide the desired asymmetric resist patterns. Each of the above parameters may be varied independently but are all preferably controlled within certain ranges to provide enhanced resist patterning results.

Any resist thickness may be employed, but it is preferred that greater thicknesses be used to provide a greater asymmetric resist pattern effect. The resist thickness will generally be about 0.1 µm to 10 µm and is preferably about 0.4 µm to 2 µm. The defocus may also vary widely and is generally greater than the thickness of the resist, generally up to about ±10 µm and preferably about ±1 µm. The exposure dose may be chosen to be such that the width of the printed line is substantially equal to the width of the corresponding mask pattern. For example, for a 5× stepper, a 2.0 µm mask feature will print a 0.4 µm width line. This is conventionally called "dose to size" and preferably, a dose of about 0.7 to 1.5 times the dose to size is preferred.

In the preferred embodiment, the illumination condition of the projection exposure tool should provide a coherency of about 0.25 to 0.8 preferably 0.6 or less.

Referring to FIG. 7a showing a mask and FIGS. 7b and 7c showing the exposed resist, a resist pattern was formed using a 365 nm (i-line) light with a 90° phase shift on one side of a 240 nm structure wafer dimensions in a positive tone resist of 0.85 μm thickness. A defocus of about −0.2 μm resulted in a substantially 90° profile on one side of the resist Q4 and a 95° profile on the other wall of the resist pattern Q3.

Figure 8A:
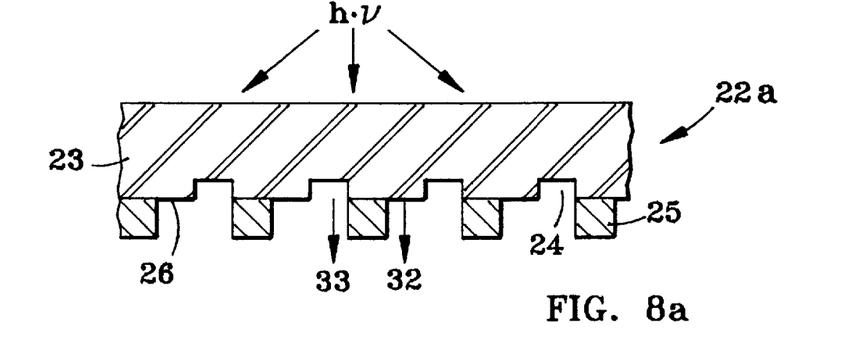
FIG. 8a shows a cross-section of a mask of the invention and FIGS. 8b and 8c show cross-sectional views of a resist pattern having asymmetric sidewalls made with a negative resist on a substrate using the mask and method of the invention.
Figure 8B:
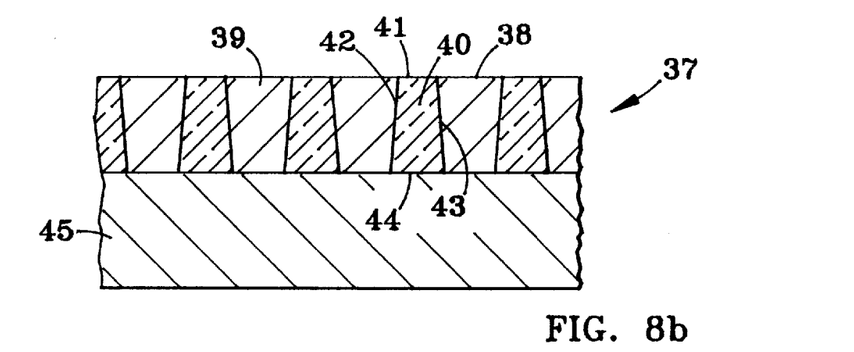
Figure 8C:
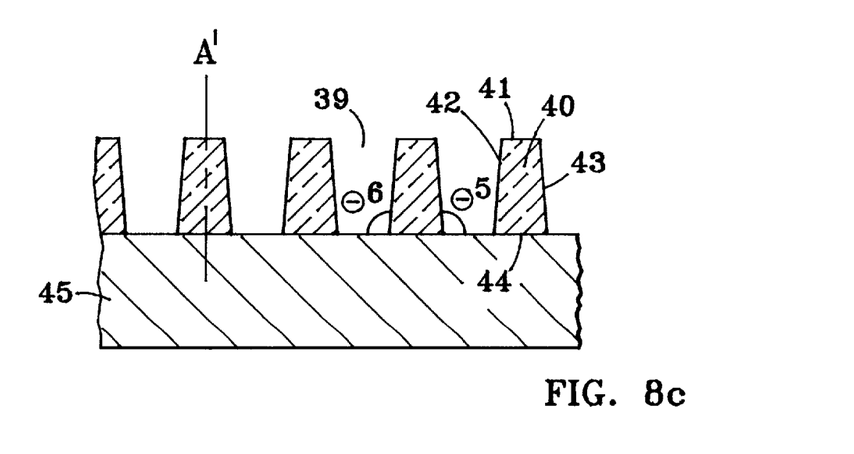

Referring to FIGS. 8a, 8b and 8c, a mask and method is described which is suited to pattern a substrate coated with a negative resists. In FIG. 8a, mask 22a comprises a transparent substrate 23, light shielding members 26 and phase shifter channels 24. The surface of the substrate is shown as 26. Light passing through the mask is shown passing through the substrate without any phase shift as 32 and passing through channel 24 and being phase shifted as 33.

In FIG. 8b, a substrate 45 coated with a negative resist 38 shown generally as 37 is exposed to light and position 40 is made insoluble and the part not exposed to light 39, remains soluble. Exposed resist 40 has sidewalls 42 and 43, a base 44 and top 41. After developing as shown in FIG. 8c, soluble resist 39 is removed leaving negative resist 40. Angle θ5 is different than angle θ6 forming an asymmetric resist pattern 40 as shown by vertical axis A'. As discussed above for FIGS. 7a, 7b and 7c, the phase shift mask produces an asymmetric light intensity profile on the resist and an asymmetric resist pattern. Non-phase shift masks would produce a symmetric light intensity profile and a symmetric resist pattern.

Figure 9A:
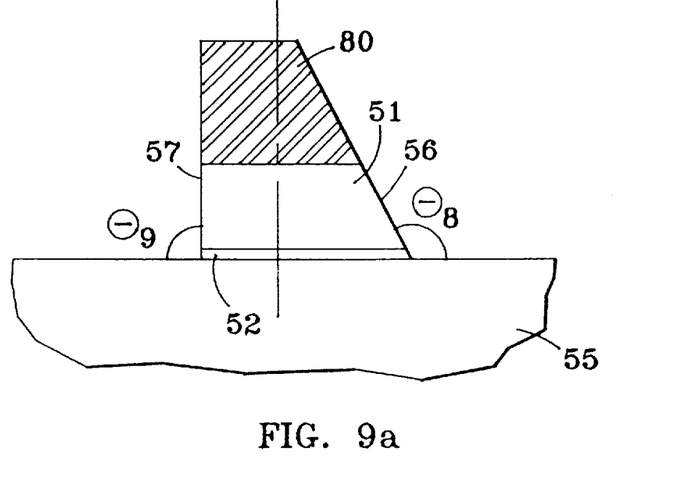
FIG. 9A shows a cross-sectional view of an intermediate step when making an asymmetric FET according to the present invention.
Figure 9B:
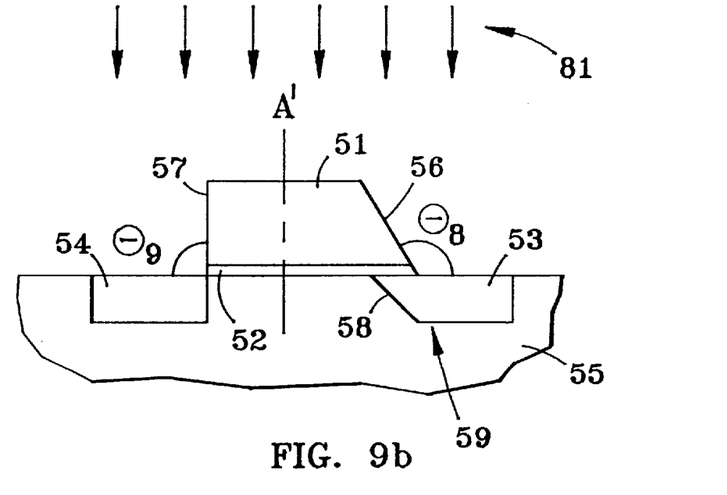
FIG. 9B shows a cross-sectional view of another intermediate step when making an asymmetric FET according to the present invention.

Using an asymmetric resist as described above, one can make the inventive asymmetric FET structures as illustrated in FIGS. 9A and 9B. An asymmetric resist 80 is formed on top of a substrate 55 covered by a thin oxide layer 52 (later serving as gate oxide) and a polysilicon layer 51 (serving as gate electrode). The shape of the resist 80 is then transferred into the polysilicon 51 and oxide layer 52 by means of etching, as shown in FIG. 9A.

Next, the drain and source regions are defined by introduction of dopants. This step either can be carried out before the asymmetric resist 80 has been removed, or after removal of the resist 80. In the former case, the resist 80 together with the polysilicon 51 serve as mask for implantation of dopants. If the resist was removed prior to implanting the dopants, only the polysilicon 51 would serve as mask. The implanting of dopants is illustrated in FIG. 9B. As shown, the dopants are implanted vertically (see arrows 81). Due to the asymmetric structure of the mask (in the present example the polysilicon 51) a lightly doped drain region 59 is created which extends underneath the gate 51, 52. This lightly doped drain region 59 has a sloped sidewall, the angle of which depends on the angle θ8 of the mask, the angle of implantation (in the present case a vertical implantation is shown) and other parameters, like the material used as mask (e.g. polysilicon), the energy of the ions used for implantation and so forth.

Figure 1B:
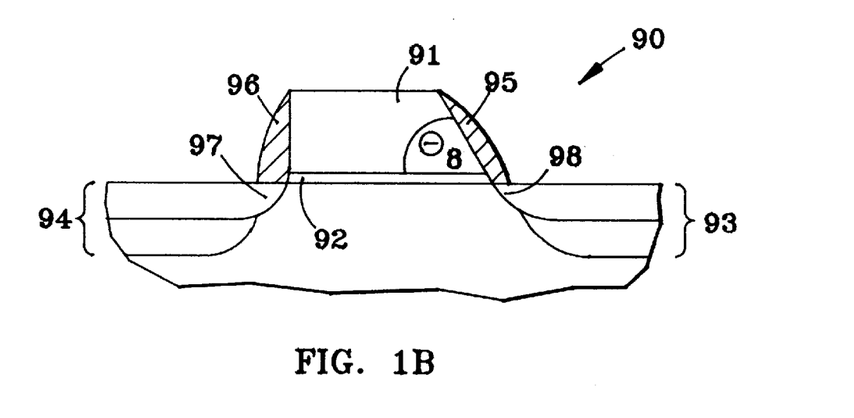
FIG. 1B shows a cross-sectional view of a second embodiment of the present invention.

In another embodiment 90 of the present invention (shown in FIG. 1B), spacers 95, 96 (comprising $SiO_2$ or $Si_3N_4$) are formed on the sidewalls of an asymmetric gate 91 after the first implant. This first implant is carried out to define the shallow implanted regions 97 and 98. A second implant is performed at a higher doping concentration, resulting in a heavily doped junction on the tapered edge (source 93) and a lightly doped junction (see 97) at the vertical edge (drain 94).

While the present invention has been particularly described, in conjunction with two specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A field effect transistor comprising:
   a first region serving as a source;
   a second region serving as a drain, said first region and said second region both being formed in a substrate;
   a thin gate oxide; and
   a gate electrode,
   said gate electrode being asymmetric, having a substantially vertical sidewall at an angle Θ9 with respect to the substrate and a sloped sidewall sloped at an angle Θ8 with respect to the substrate, Θ8 and Θ9 being unequal,
   said second region extending underneath said sloped sidewall, wherein part of said second region which extends underneath said gate electrode is more lightly doped than the remaining part of said second region, and wherein
   said second region has a sloped junction edge with an angle Θ10 underneath said gate electrode.

2. The field effect transistor of claim 1, wherein Θ8 is greater than Θ9, and Θ8 is at most 150°.

3. The field effect transistor of claim 1, wherein θ10 is approximately the same as θ8.

4. The field effect transistor of claim 1, wherein θ10 is between 90° and 150°.

5. The field effect transistor of claim 1, wherein said substrate is a silicon substrate.

6. The field effect transistor of claim 1, wherein said first and second regions are n-type doped and comprise:
   P, As, or Sb, or any combination thereof.

7. The field effect transistor of claim 1, wherein said first and second regions are p-type doped and comprise:
   B, In, or Ga, or any combination thereof.

8. The field effect transistor of claim 1, wherein said part of said second region which extends underneath said gate electrode extends between 5 nm and 80 nm underneath the gate.

9. A semiconductor device comprising:
   at least one field effect transistor having a first region serving as a source, a second region serving as a drain, and a gate disposed on a substrate, the gate including a thin gate oxide and a gate electrode,
   said gate electrode being asymmetric, having a substantially vertical sidewall at an angle Θ9 with respect to the substrate and a sloped sidewall sloped at an angle Θ8 with respect to the substrate, Θ8 and Θ9 being unequal,
   said second region extending underneath said sloped sidewall, wherein part of said second region which extends underneath said gate electrode is less doped than the remaining part of said second region, and wherein
   said second region has a sloped junction edge with an angle Θ10 underneath said gate electrode.

10. The semiconductor device of claim 9 being a MOS or CMOS device, a dynamic random access memory, or a logic device.

11. A field effect transistor comprising:
   a first region serving as a source;
   a second region serving as a drain, said first region and said second region both being formed in a substrate;
   a thin gate oxide; and a gate electrode, said gate electrode being asymmetric, having a sloped sidewall sloped at an angle $\Theta 8$ with respect to the substrate and a sidewall being approximately vertical with an angle $\Theta 9$ with respect to the substrate, $\Theta 8$ and $\Theta 9$ being unequal, a thick spacer being formed on said sidewall being approximately vertical, a thin spacer being formed on said sloped sidewall, said second region extending underneath said thick spacer, wherein part of said second region which extends underneath said thick spacer is more lightly doped than the remaining part of said second region thus providing for a graded junction.

12. The field effect transistor of claim 11, wherein $\Theta 8$ is greater than $\Theta 9$, and $\Theta 8$ is at most 150°.

13. The field effect transistor of claim 11, wherein said substrate is a silicon substrate.

14. The field effect transistor of claim 11, wherein said first and second regions are n-type doped and comprise:

P, As, or Sb, or any combination thereof.

15. The field effect transistor of claim 11, wherein said first and second regions are p-type doped and comprise:

B, In, or Ga, or any combination thereof.

16. The field effect transistor of claim 11, wherein said part of said second region which extends underneath said thick spacer extends between 5 nm and 80 nm underneath the spacer.

17. A semiconductor device comprising at least one field effect transistor having a first region serving as a source, a second region serving as a drain, said first region and said second region both being formed in a substrate, a thin gate oxide and a gate electrode, said gate electrode being asymmetric, having a sloped sidewall sloped at an angle $\Theta 8$ with respect to the substrate and a sidewall being approximately vertical with an angle $\Theta 9$ with respect to the substrate, $\Theta 8$ and $\Theta 9$ being unequal, a thick spacer being formed on said sidewall being approximately vertical, a thin spacer being formed on said sloped sidewall, said second region extending underneath said thick spacer, wherein part of said second region which extends underneath said thick spacer is more lightly doped than the remaining part of said second region, thus providing for a graded junction.

18. The semiconductor device of claim 17 being a MOS or CMOS device, a dynamic random access memory, or a logic device.

19. A field effect transistor comprising:

a first region serving as a source;

a second region serving as a drain, said first region and said second region both being formed in a substrate;

a thin gate oxide; and a gate electrode, said gate electrode being asymmetric, having a substantially vertical sidewall at an angle $\Theta 9$ with respect to the substrate and a substantially straight sloped sidewall sloped at an angle $\Theta 8$ with respect to the substrate, $\Theta 8$ and $\Theta 9$ being unequal, said second region extending underneath said sloped sidewall, wherein part of said second region which extends underneath said gate electrode is more lightly doped than the remaining part of said second region, and wherein said second region has a sloped junction edge with an angle $\Theta 10$ underneath said gate electrode.

20. A field effect transistor comprising:

a first region serving as a source;

a second region serving as a drain, said first region and said second region both being formed in a substrate;

a thin gate oxide; and a gate electrode, said gate electrode having a substantially flat top and being asymmetric, having a substantially vertical sidewall at an angle $\Theta 9$ with respect to the substrate and a sloped sidewall sloped at an angle $\Theta 8$ with respect to the substrate, $\Theta 8$ and $\Theta 9$ being unequal, said second region extending underneath said sloped sidewall, wherein part of said second region which extends underneath said gate electrode is more lightly doped than the remaining part of said second region, and wherein said second region has a sloped junction edge with an angle $\Theta 10$ underneath said gate electrode.

* * * * *